(12) United States Patent
Futatsugi

(10) Patent No.: US 10,593,724 B2
(45) Date of Patent: Mar. 17, 2020

(54) METHOD OF MANUFACTURING A SEMICONDUCTOR DEVICE

(71) Applicant: SII Semiconductor Corporation, Chiba-shi, Chiba (JP)

(72) Inventor: Toshiro Futatsugi, Chiba (JP)

(73) Assignee: ABLiC iNC. (JP)

( * ) Notice: Subject to any disclaimer, the term of this patent is extended or adjusted under 35 U.S.C. 154(b) by 0 days.

(21) Appl. No.: 16/031,480

(22) Filed: Jul. 10, 2018

(65) Prior Publication Data

US 2018/0323233 A1 Nov. 8, 2018

Related U.S. Application Data

(62) Division of application No. 15/446,680, filed on Mar. 1, 2017, now Pat. No. 10,043,848.

(30) Foreign Application Priority Data

Mar. 4, 2016 (JP) .................. 2016-042297

(51) Int. Cl.
*H01L 27/32* (2006.01)
*H01L 27/146* (2006.01)
*H01L 29/66* (2006.01)
*H01L 29/78* (2006.01)

(52) U.S. Cl.
CPC .. *H01L 27/14689* (2013.01); *H01L 27/14616* (2013.01); *H01L 27/14685* (2013.01); *H01L 29/6659* (2013.01); *H01L 29/66492* (2013.01); *H01L 29/7833* (2013.01)

(58) Field of Classification Search
USPC .......... 257/20, 194, 135–136, 213–413, 900, 257/902–903; 438/136, 137, 455–458, 438/149–165, 173, 192, 206, 212, 424, 438/427, 428, 591
See application file for complete search history.

(56) References Cited

U.S. PATENT DOCUMENTS

| 6,166,405 A | 12/2000 | Kuriyama ..................... 257/290 |
| 9,214,489 B2 | 12/2015 | Sugawa et al. | |
| 2004/0000681 A1* | 1/2004 | Shinohara ......... H01L 27/14609 257/290 |
| 2006/0086955 A1* | 4/2006 | Iwata ................ H01L 27/14609 257/226 |
| 2007/0012963 A1* | 1/2007 | Han .................. H01L 27/14603 257/290 |

(Continued)

OTHER PUBLICATIONS

Abstract, Publication No. 2014-154793, Publication Date Aug. 25, 2014.

(Continued)

*Primary Examiner* — Moin M Rahman
(74) *Attorney, Agent, or Firm* — Adams & Wilks

(57) ABSTRACT

In order to form a light receiving element having high reliability and a MOS transistor together on the same silicon substrate, after forming a gate electrode of the MOS transistor, a gate oxide film in a light receiving element forming region is removed. Then, a thermal oxide film is newly formed in the light receiving element forming region, and ion implantation is performed in the light receiving element forming region through the thermal oxide film such that a shallow pn junction is formed.

6 Claims, 8 Drawing Sheets

(56) References Cited

U.S. PATENT DOCUMENTS

2013/0069156 A1* 3/2013 Miura ............... H01L 29/78615
  257/335

OTHER PUBLICATIONS

Kuroda, R. et al. A Highly Ultraviolet Light Sensitive and Highly Robust Image Sensor Technology Based on Flattened Si Surface, ITE Trans. On MTA, vol. 2, No. 2 (2014), pp. 123-130.
Nakazawa, T. et al. Photodiode dopant structure with atomically flat Si surface for high-sensitivity and stability to UV light, SPIE-IS&T, vol. 8298, (2012) pp. 82980M-1-82980M-8.

* cited by examiner

METHOD OF MANUFACTURING A SEMICONDUCTOR DEVICE

CROSS REFERENCE TO RELATED APPLICATION

This application is a division of U.S. application Ser. No. 15/446,680 filed Mar. 1, 2017, which claims the benefit of Japanese Patent Application No. 2016-042297 filed Mar. 4, 2016, which is hereby incorporated by reference, and priority thereto for common subject matter is hereby claimed.

BACKGROUND OF THE INVENTION

1. Field of the Invention

The present invention relates to a semiconductor device and a method of manufacturing a semiconductor device, and particularly, to a semiconductor device and a method of manufacturing a semiconductor device, in which a semiconductor light receiving element configured to detect short-wavelength light, for example, an ultraviolet light, and a MOS transistor are formed on the same silicon substrate.

2. Description of the Related Art

There are various types of semiconductor light receiving elements. Among those semiconductor light receiving elements, a light receiving element formed on a silicon substrate is used in many applications. This is because, by forming an integrated circuit including a MOS transistor or the like and the light receiving element on the same substrate, a process from receiving light to processing a signal can be conducted on one chip.

A penetration depth of light in silicon (a depth at which an intensity of the incident light to the silicon is attenuated to 1/e due to absorption) has a wavelength dependence, as shown in FIG. 7. Thus, in a case of an ultraviolet light (UVA: from 320 nm to 400 nm, and UVB: from 280 nm to 320 nm), most light is absorbed in a range of from several nanometers to several tens of nanometers. Structures for detecting the ultraviolet light using silicon, which has such features, are disclosed in Japanese Patent No. 5692880 and described in ITE Trans. on MTA Vol. 2 No. 2 pp. 123-130 (2014).

Specifically, in order to detect an electron-hole pair generated by irradiation of the ultraviolet light as a photocurrent, a depth of a pn junction is made shallow to be in a range from about several tens of nanometers to about several hundreds of nanometers. Further, having an impurity profile in which an impurity concentration in an outermost silicon surface is $10^{19}$ $cm^{-3}$ or more and the concentration gradually decreases along a depth direction, generation of an electric field due to a concentration gradient causes effective separation of the electron-hole pair, permitting acquisition of the photocurrent.

In such a silicon light receiving element structure, when charges are trapped in an insulating film on silicon due to the irradiation of the ultraviolet light, a band structure of the pn junction may be affected such that sensitivity characteristic of the light receiving element fluctuates, as described in SPIE-IS&T/Vol. 8298 82980M-1-8 (2012). Accordingly the insulating film that is in contact with the silicon surface needs to be a thermal silicon oxide film having comparatively few charge traps. A high impurity concentration in the outermost silicon surface also has an advantage in that an influence of fixed charges in the insulating film is shielded.

Meanwhile, a related-art method involving forming an ultraviolet light receiving element including silicon and the MOS transistor together are disclosed in Japanese Patent Application Laid-open No. 2014-154793, for example. FIGS. 8A to 8D and FIGS. 9A to 9D are cross-sectional views for illustrating a manufacturing method of the related art in the order of steps. In FIGS. 8A to 8D and FIGS. 9A to 9D, PD represents a light receiving element forming region in which the light receiving element is formed, and TR represents a MOS transistor forming region in which a PMOS transistor is formed.

First, as illustrated in FIG. 8A, N-well regions 102 and an element isolation region 103 are formed on a surface of a p-type silicon substrate 101. Ion implantation for adjusting a threshold voltage of a transistor is performed as necessary, and then a gate oxide film 104 is formed through thermal oxidation.

Next, as illustrated in FIG. 8B, a polysilicon film 105, which is a material of a gate electrode, is deposited and patterned through etching such that a gate electrode 106 is formed (FIG. 8C).

Then, the light receiving element forming region PD is masked by a first photoresist film (not shown), ion implantation is performed on the MOS transistor forming region TR, to thereby form lightly doped drain (LDD) regions 109 (FIG. 8D).

The first photoresist film is removed, and then an insulating film 110 is deposited over the entire surface (FIG. 9A). The light receiving element forming region PD is masked by a second photoresist film (not shown) so as to prevent removal of the gate oxide film 104 in the light receiving element forming region PD, and anisotropic etching is performed. As a result, side walls 111 are formed on side surfaces of the gate electrode 106, and the gate oxide film 104 and the insulating film 110 remain in the light receiving element forming region PD (FIG. 9B).

Subsequently, ion implantation is performed on the MOS transistor forming region TR, to thereby form source/drain regions 112 (FIG. 9C).

Then, ion implantation for forming a shallow junction is performed on the light receiving element forming region PD, to thereby form an impurity region 108 (FIG. 9D).

As described above, according to the related-art manufacturing method, a MOS transistor and an ultraviolet light receiving element, which is formed from silicon and has a pn junction, can be formed together on the same silicon substrate.

In the related-art manufacturing method illustrated in FIGS. 8A to 8D and FIGS. 9A to 9D, the insulating film that is in direct contact with the surface of the silicon substrate in the light receiving element forming region PD is the gate oxide film 104 that remains after the patterning for forming the gate electrode. Hence, although the insulating film is a thermal oxide film, a quality of the insulating film may be deteriorated due to etching damage at the time of gate patterning. As described above, in order to suppress fluctuation in the sensitivity characteristics of the light receiving element, the insulating film that is in direct contact with the silicon surface needs to be a thermal silicon oxide film having comparatively few charge traps. Thus, the light receiving element in which the gate oxide film 104 having a deteriorated quality is in direct contact with the silicon surface has low reliability.

Further, the insulating film 110 that is deposited to form the side walls 111 is, in general, thicker than the gate oxide film 104 (for example, in Japanese Patent Application Laid-open No. 2014-154793, the gate oxide film has a thickness of from 10 nm to 50 nm, and the insulating film for the side walls has a thickness of from 200 nm to 500 nm). A high dose amount of more than $10^{16}$ cm$^{-2}$ is thus needed in order to perform ion implantation on the light receiving element forming region PD through laminated films formed of the gate oxide film 104 and the insulating film 110 for the side walls, to thereby attain a desired concentration in the impurity region 108.

When ion implantation with this dose amount is performed at one time, failures, such as burning and sticking of a resist, may occur in the manufacturing process. Accordingly ion implantation is, in general, performed separately two times or more, which decreases a throughput. Further, since a junction depth becomes about 200 nm, a shallow junction of 100 nm or less, which is essentially needed to detect the ultraviolet light with high sensitivity, is not obtained. Still further, the impurity concentration of $10^{19}$ cm$^{-3}$ or more is needed in the outermost silicon surface.

SUMMARY OF THE INVENTION

The present invention has been made in order to provide a semiconductor device and a method of manufacturing a semiconductor device, in which a light receiving element having high reliability and a MOS transistor together are formed on the same silicon substrate.

According to one embodiment of the present invention, there is provided a method of manufacturing a semiconductor device, including: a first step of forming a first thermal oxide film, which serves as a gate oxide film of a MOS transistor, on a surface of a silicon substrate including a light receiving element forming region and a MOS transistor forming region; a second step of forming a polysilicon film on the first thermal oxide film; a third step of patterning the polysilicon film, to thereby form a gate electrode of the MOS transistor in the MOS transistor forming region; a fourth step of removing the first thermal oxide film other than the first thermal oxide film under the gate electrode; a fifth step of forming a second thermal oxide film on the surface of the silicon substrate; and a sixth step of performing ion implantation of an impurity on the light receiving element forming region through the second thermal oxide film, to thereby form an impurity region.

According to the embodiment of the present invention, the second thermal oxide film is newly formed after the first thermal oxide film other than that under the gate electrode is removed. Thus, the thermal oxide film, which is not damaged through etching in the patterning of the polysilicon film, can be an insulating film that is in direct contact with the surface of the silicon substrate in the light receiving element forming region. Further, the thickness of the second thermal oxide film can be set regardless of the thickness of the gate oxide film. Accordingly, by forming the second thermal oxide film, which has comparatively few charge traps, to have an appropriate thickness (for example, a thickness of 30 nm or less) and by performing ion implantation on the light receiving element forming region through the second thermal oxide film to form the impurity region, a dose amount in the ion implantation can be kept low, and there can be formed the light receiving element, which has a shallow junction in which an impurity concentration in the outermost surface of the silicon substrate in the impurity region is $10^{19}$ cm$^{-3}$ or more, and a depth from the surface of the silicon substrate at which the impurity concentration in the impurity region becomes $10^{17}$ cm$^{-3}$ or less is 100 nm or less.

DESCRIPTION OF THE EMBODIMENTS

First Embodiment

FIGS. 1A to 1E and FIGS. 2A to 2D are cross-sectional views for illustrating a method of manufacturing a semiconductor device of a first embodiment of the present invention in the order of steps.

In FIGS. 1A to 1E and FIGS. 2A to 2D, PD represents a light receiving element forming region in which a light receiving element is formed, and TR represents a MOS transistor forming region in which a PMOS transistor is formed.

Figure 1A:
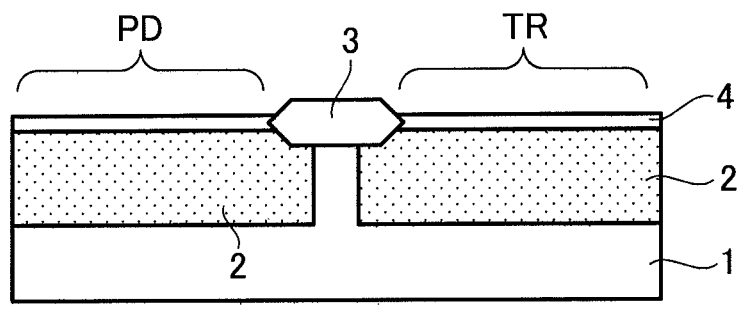
FIGS. 1A to 1E are cross-sectional views for illustrating a method of manufacturing a semiconductor device of a first embodiment of the present invention in the order of steps.

First, as illustrated in FIG. 1A, N-well regions 2 and an element isolation region 3 are formed on a surface of a p-type silicon substrate 1, and then ion implantation for adjusting a threshold voltage of a transistor is performed as necessary.

Then, the entire surface of the silicon substrate 1 is thermally oxidized, to thereby form a gate oxide film (also referred to as "first thermal oxide film") 4. The gate oxide film 4 has a thickness of 10 nm, for example.

Figure 1B:
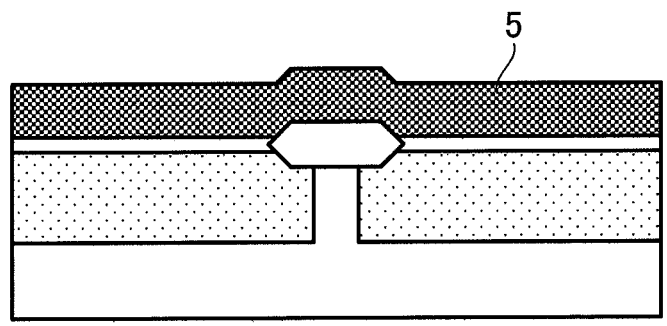
Figure 1C:
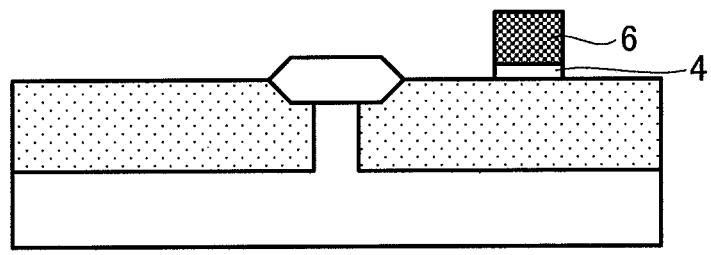

Next, a polysilicon film 5, which is a material of a gate electrode 6, is deposited (FIG. 1B). The polysilicon film 5 is patterned through etching such that the gate electrode 6 is formed. In order to remove foreign matters remaining after the etching, a wet process is performed such that the gate oxide film 4 other than that under the gate electrode 6 is removed (FIG. 1C).

Figure 1D:
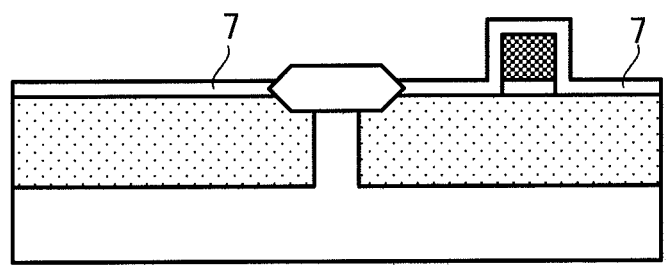

Then, the entire surface is thermally oxidized, to thereby form a thermal oxide film (also referred to as "second thermal oxide film") 7 on a surface of the silicon substrate 1, and on side surfaces and an upper surface of the gate electrode 6 (FIG. 1D). The thickness of the thermal oxide film 7 is 10 nm in the light receiving element forming region PD, for example. To thermally oxidize the side surfaces of the gate electrode 6 in this step has a role of removal of etching damage when the gate electrode 6 is patterned, and prevention of ion penetration through the gate electrode 6 when ion implantation for forming source/drain regions is performed in a later step.

Figure 1E:
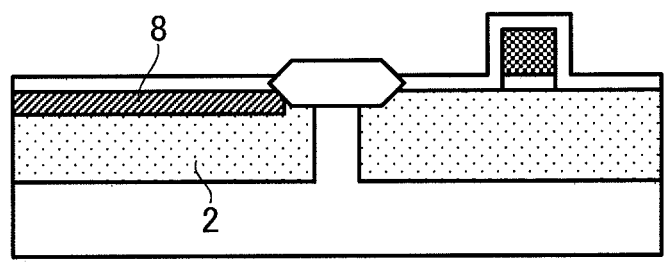

Next, ion implantation of a p-type impurity is performed on the N-well region 2 in the light receiving element forming region PD through the thermal oxide film 7, to thereby form a p-type impurity region 8 (FIG. 1E). Implantation conditions of the ion implantation are $BF_2$, 10 keV, and $5.0\times10^{13}$ $cm^{-2}$, for example. As a result, a shallow pn junction is formed. The thermal oxide film 7 is not the gate oxide film (first thermal oxide film) 4 but a thermal oxide film newly formed after removing the gate oxide film 4, and hence is not damaged through etching or the like. Further, the ion implantation may be performed while other insulating films are not formed on the thermal oxide film 7.

As a result, a dose amount of the ion implantation may be kept low as described above, and there may be formed the light receiving element, which has high reliability and has the shallow junction in which the impurity concentration of the outermost surface of the silicon substrate in the impurity region is $10^{19}$ $cm^{-3}$ or more, and a depth from the surface of the silicon substrate at which the impurity concentration in the impurity region becomes $10^{17}$ $cm^{-3}$ or less is 100 nm or less.

Figure 2A:
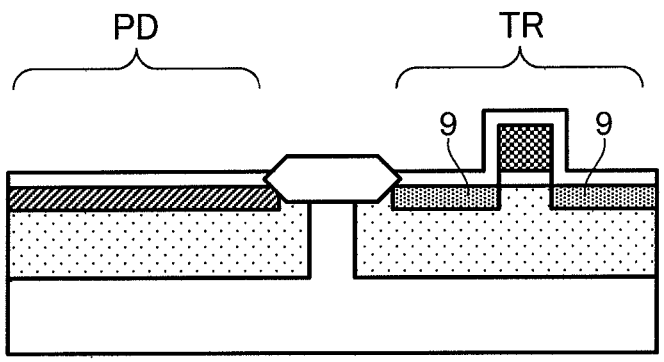
FIGS. 2A to 2D are cross-sectional views for illustrating the method of manufacturing a semiconductor device of the first embodiment of the present invention in the order of steps.

Subsequently, the p-type impurity ion implantation is performed on the MOS transistor forming region TR in which the gate electrode 6 and the second thermal oxide film 7 formed on the side surfaces of the gate electrode are used as a mask, to thereby form lightly doped drain (LDD) regions 9 in a self-alignment manner (FIG. 2A).

Figure 2B:
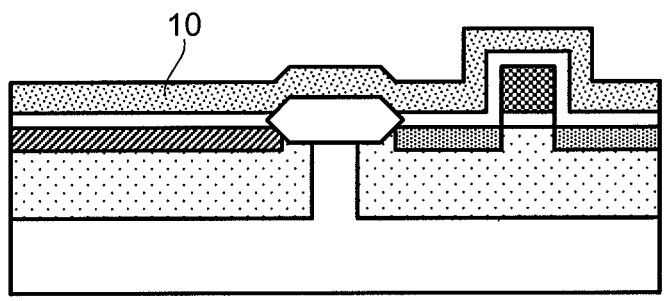
Figure 2C:
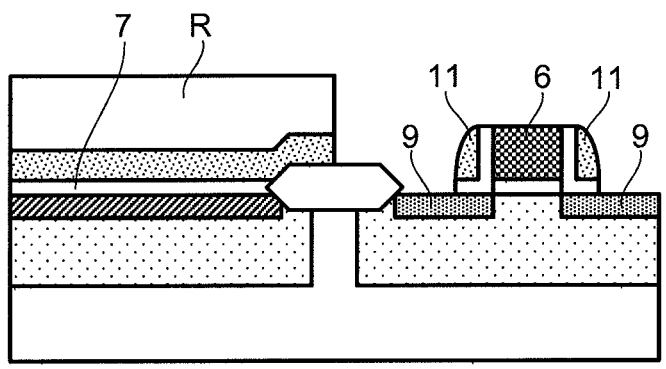

Next, an insulating film 10 is deposited on the entire surface (FIG. 2B). The insulating film 10 has a thickness of 300 nm, for example. Subsequently, the light receiving element forming region PD is covered with a mask layer R formed of a resist, and then anisotropic etching is performed in the light receiving element forming region PD in that state, to thereby form side walls 11 on the side surfaces of the gate electrode 6 (FIG. 2C). Surfaces of the LDD regions 9 in the MOS transistor forming region TR are removed until the thermal oxide film 7 is removed. However, the light receiving element forming region PD is covered with the mask layer R, and hence the insulating film 10 remains in the light receiving element forming region PD. Thus, the thermal oxide film 7 that is in direct contact with the surface of the silicon substrate 1 is less likely to be damaged through etching.

Figure 2D:
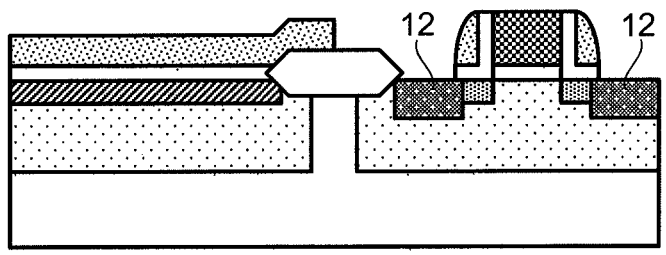

Then, as illustrated in FIG. 2D, the p-type impurity ion implantation is performed on the MOS transistor forming region TR, to thereby form the source/drain regions 12. Then, a high-temperature short-time activation annealing is performed at 950° C. for 1 second, for example, such that the shallow junction in the light receiving element forming region PD remains intact.

Figure 5:
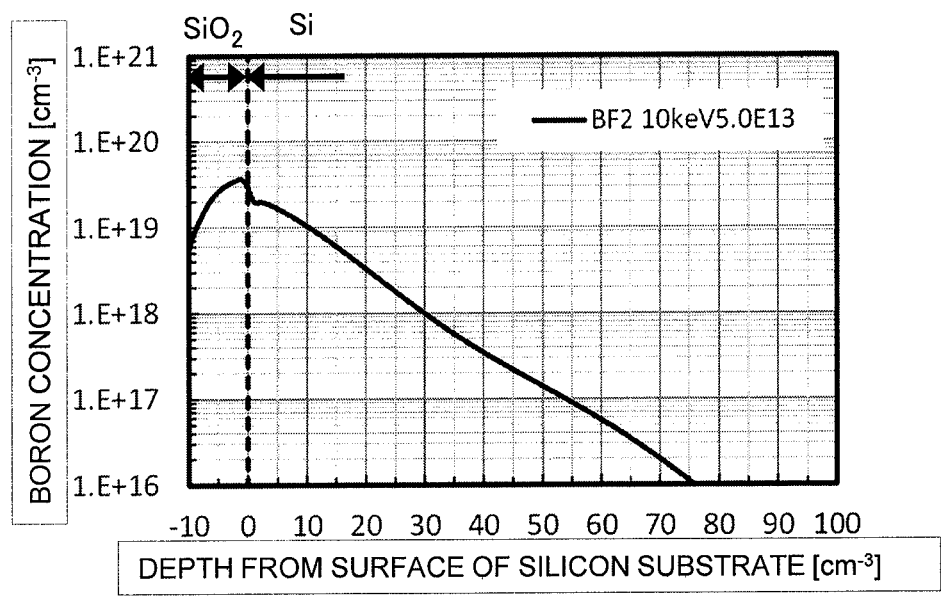
FIG. 5 is a graph for showing a concentration profile of boron after BF$_2$ injection through a thermal oxide film having a thickness of 10 nm.

A concentration profile of boron in the light receiving element forming region PD that is formed as above is shown in FIG. 5. As described above, the thickness of the thermal oxide film 7 in the light receiving element forming region PD is 10 nm, and the ion implantation conditions are $BF_2$, 10 keV, and $5.0\times10^{13}$ $cm^{-2}$.

As shown in FIG. 5, a boron concentration of the outermost silicon surface is $2\times10^{19}$ $cm^{-3}$, and a depth from the silicon surface at which the boron concentration becomes $10^{17}$ $cm^{-3}$ or less is 55 nm. Hence, an impurity profile needed in order to detect an ultraviolet light with high sensitivity may be achieved.

As described above, according to this embodiment, since the dose amount of the ion implantation for forming the impurity region 8 is in the $10^{13}$ $cm^{-2}$ range, the light receiving element, which has the impurity profile as shown in FIG. 5 and has high reliability, may be formed together with the MOS transistor through a manufacturing method that matches with the manufacturing steps of the MOS transistor, without the failures in the manufacturing that occur in the related-art manufacturing method.

Second Embodiment

Figure 3A:
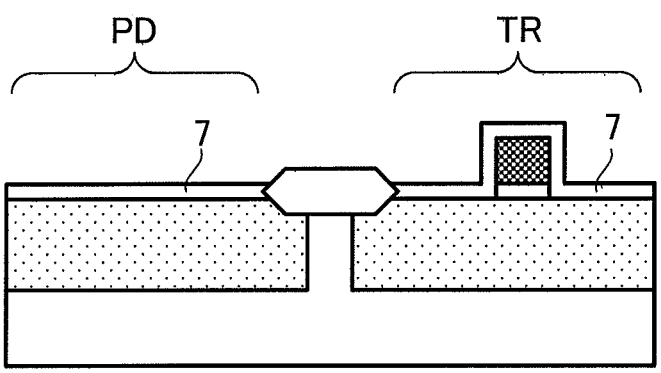
FIGS. 3A and 3B are cross-sectional views for illustrating a method of manufacturing a semiconductor device of a second embodiment of the present invention in the order of steps.
Figure 3B:
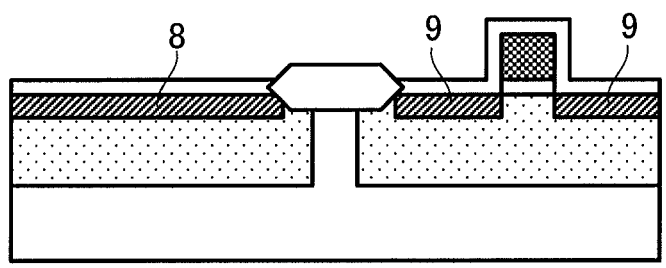

FIGS. 3A and 3B are cross-sectional views for illustrating a manufacturing method of a second embodiment of the present invention in the order of steps. In FIG. 3A, the same step as that of FIG. 1D is illustrated. Steps up to this step are the same as those in the first embodiment, and the descriptions thereof are thus omitted. However, in this embodiment, the thickness of the thermal oxide film 7 is set to be 30 nm, which is thicker than that of the first embodiment.

In this state, as illustrated in FIG. 3B, ion implantation for forming a shallow junction is performed on the light receiving element forming region PD. The ion implantation conditions are $BF_2$, 15 keV, and $5.3\times10^{14}$ $cm^{-2}$, for example. This ion implantation is also performed on the MOS transistor forming region TR, to thereby form the LDD regions 9.

After the step of FIG. 3B, the PMOS transistor and the light receiving element may be formed on the same silicon surface by following the same steps as illustrated in FIG. 2B and in the subsequent drawings.

Through use of the method of this embodiment, since the formation of the impurity region 8 in the light receiving element forming region PD, that is, the ion implantation for forming the shallow junction also serves as the ion implantation for forming the LDD regions 9 of the MOS transistor, the number of steps may be reduced as compared to the first embodiment.

Figure 6:
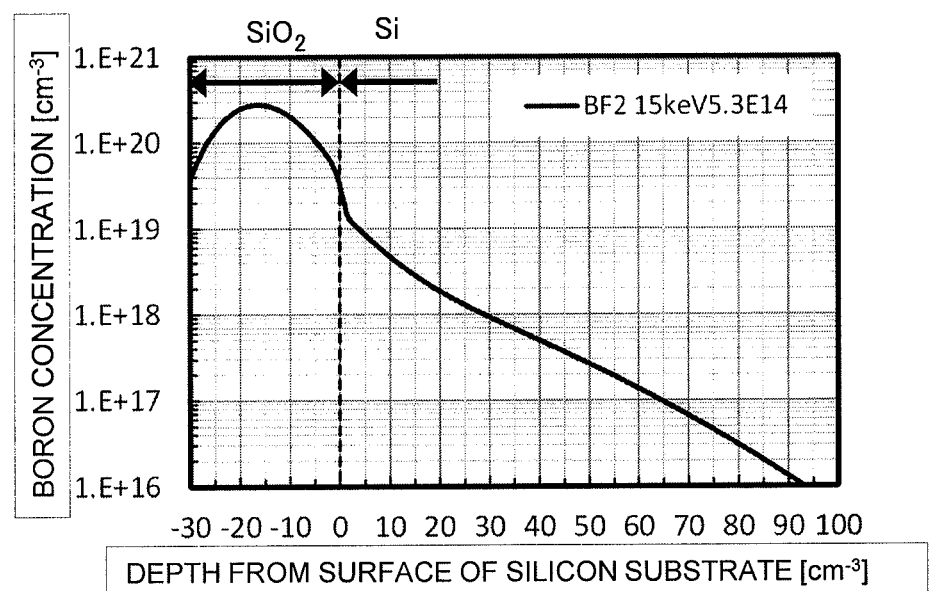
FIG. 6 is a graph for showing a concentration profile of boron after BF$_2$ injection through a thermal oxide film having a thickness of 30 nm.
Figure 7:
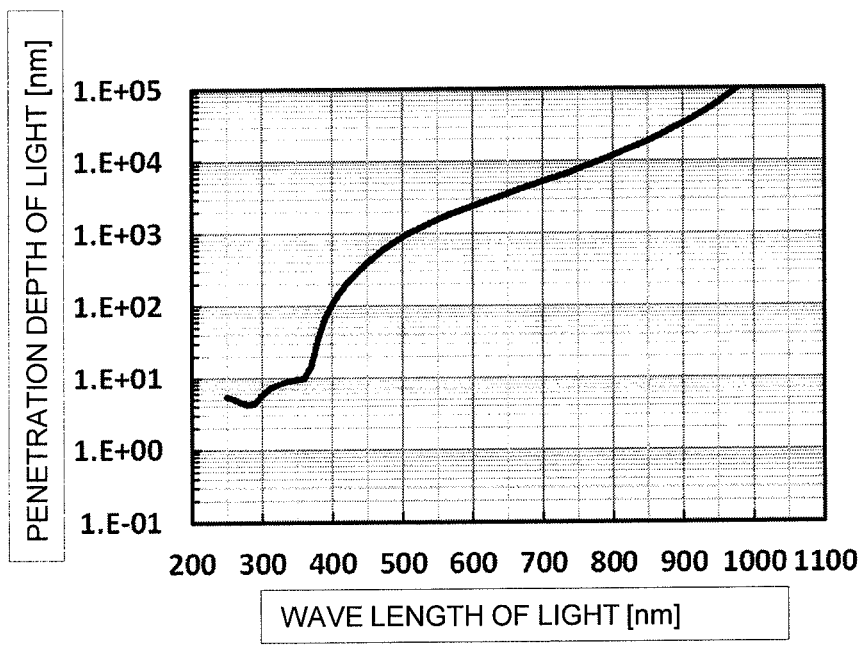
FIG. 7 is a graph for showing wavelength dependence to a light penetration depth of the incident light to silicon.
Figure 8A:
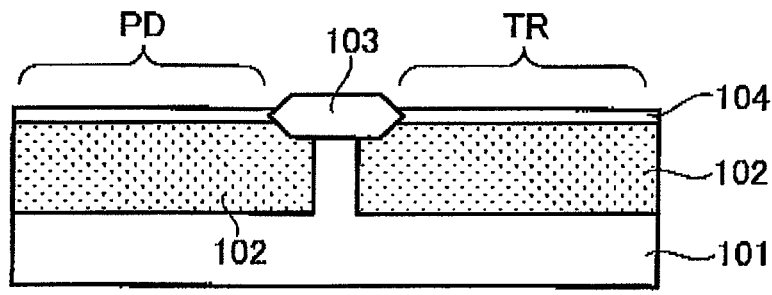
FIGS. 8A to 8D are cross-sectional views for illustrating a related-art method of manufacturing a semiconductor device in the order of steps.
Figure 8B:
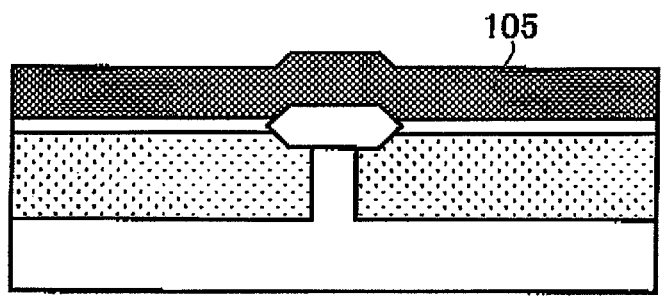
Figure 8C:
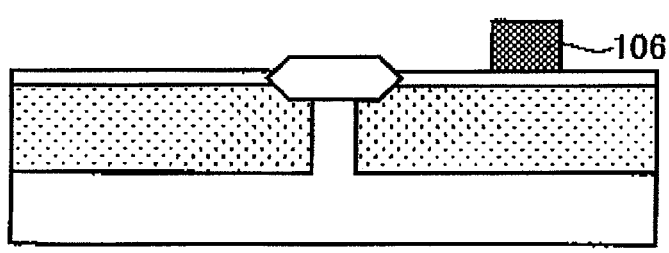
Figure 8D:
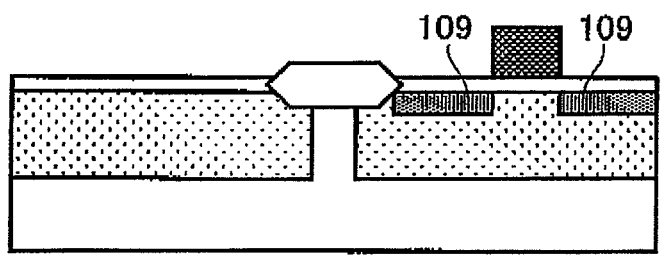
Figure 9A:
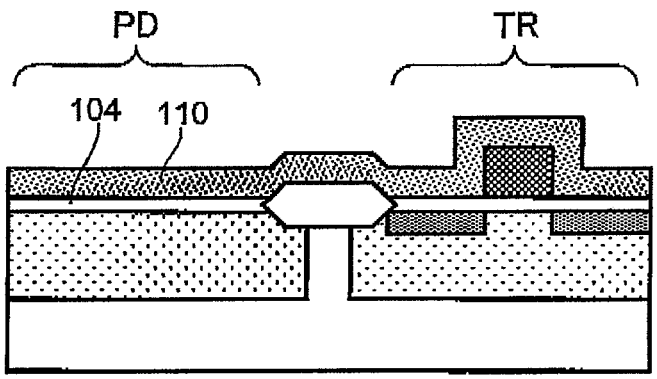
FIGS. 9A to 9D are cross-sectional views for illustrating the related-art method of manufacturing a semiconductor device in the order of steps.
Figure 9B:
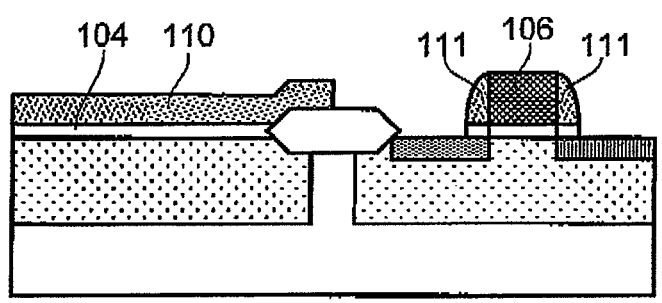
Figure 9C:
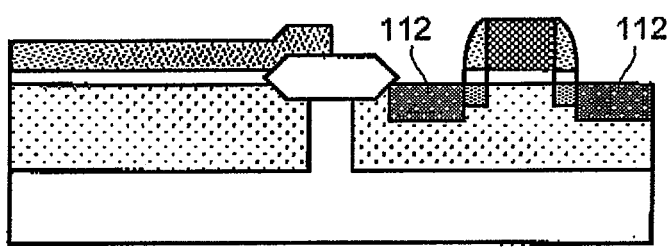
Figure 9D:
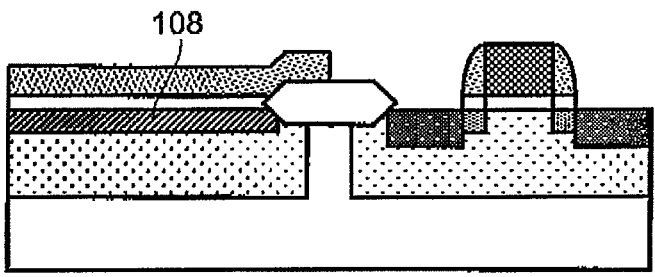

A concentration profile of boron in the light receiving element forming region PD of this embodiment is shown in FIG. 6. As described above, the thickness of the thermal oxide film 7 in the light receiving element forming region PD is 30 nm, and the ion implantation conditions are $BF_2$, 15 keV, and $5.0\times10^{14}$ $cm^{-2}$.

As shown in FIG. 6, a boron concentration of the outermost silicon surface is $2\times10^{19}$ $cm^{-3}$, and a depth from the silicon surface at which the boron concentration becomes $10^{17}$ $cm^{-3}$ or less is 65 nm. Hence, an impurity profile needed in order to detect an ultraviolet light with high sensitivity may be achieved.

As can be seen from FIG. 5 and FIG. 6, in a case where the ion implantation is performed through an oxide film, when the thickness of the oxide film is changed from 10 nm to 30 nm, the dose amount of implantation needs to be increased by an order of magnitude in order to set the boron concentration in the outermost silicon surface to be $10^{19}$ $cm^{-3}$ or more. Further, when the oxide film is formed to be thicker, implantation energy also needs to be raised, and thus it becomes difficult to form the shallow junction with high controllability. As a result, it is desired that the thickness of the oxide film be 30 nm or less.

Third Embodiment

Figure 4A:
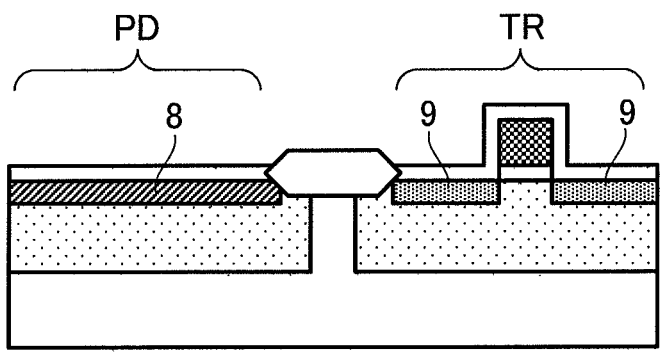
FIGS. 4A to 4D are cross-sectional views for illustrating a method of manufacturing a semiconductor device of a third embodiment of the present invention in the order of steps.

FIGS. 4A to 4D are cross-sectional views for illustrating a manufacturing method of a third embodiment of the present invention in the order of steps. In FIG. 4A, the same step as that of FIG. 2A is illustrated. Steps up to this step are the same as those in the first embodiment, and the descriptions thereof are thus omitted.

Figure 4B:
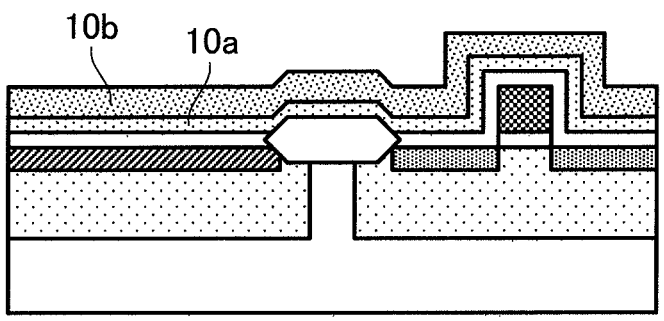

Next, as illustrated in FIG. 4B, insulating films 10a and 10b for forming side walls are deposited. In this case, the insulating film 10a is a silicon nitride film having a thickness of 20 nm, and the insulating film 10b is a silicon dioxide film having a thickness of 280 nm. Further, the thermal oxide film 7 on the surface of the light receiving element forming region has a thickness of 30 nm or less.

Figure 4C:
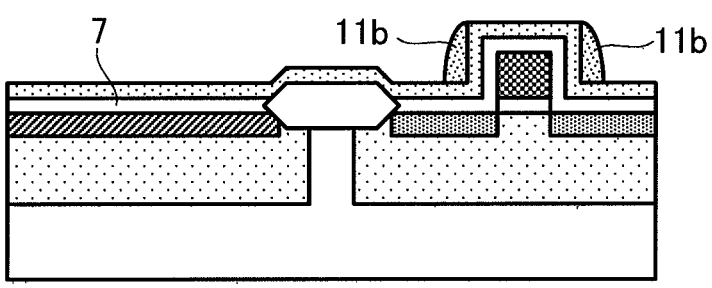
Figure 4D:
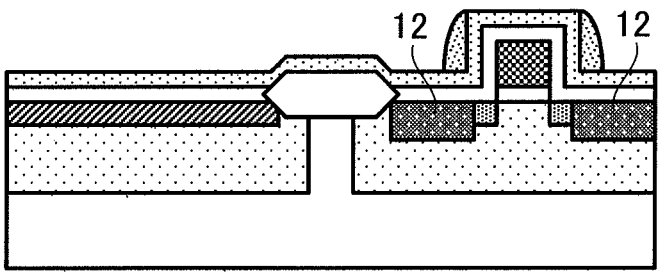

Subsequently, as illustrated in FIG. 4C, side walls 11b including the insulating film (silicon dioxide film) 10b are formed on the side surfaces of the gate electrode 6 through anisotropic etching. Through use of etching conditions in which an etching rate of the oxide film is high, and an etching rate of the nitride film is low, the insulating film (silicon nitride film) 10a remains as an etching stopper. As a result, the etching damage to the thermal oxide film 7 that is in direct contact with the silicon surface in the light receiving element forming region PD may be reduced. After forming the side walls 11b, ion implantation is performed to form the source/drain regions 12 (FIG. 4D).

As described above, the MOS transistor and the light receiving element may be formed together on the same silicon substrate.

Through use of the method of this embodiment, there is no need to cover the insulating film in the light receiving element forming region PD with a resist when the side walls 11b are formed, and hence the number of steps may be reduced. In this embodiment, the nitride film 10a and the oxide film 10b have a laminated structure. However, when the nitride film is near the silicon surface, the nitride film functions as a charge trap, and may affect characteristics of the light receiving element or characteristics of the MOS transistor. In that case, a structure having three or more layers such as an oxide film/nitride film/oxide film structure may also be used.

Further, in the laminated structure formed of the nitride film and the oxide film in the light receiving element forming region PD, transmittance of a particular wavelength range of light may be selectively increased by optimally designing each film thickness. As a result, the light receiving element having a high sensitivity to a particular wavelength range may also be manufactured.

The embodiments of the present invention have been described above, but needless to say, the present invention is not limited to those embodiments, and various changes may be made thereto without departing from the gist of the present invention.

For example, in each of the embodiments described above, an example of manufacturing the PMOS transistor and the light receiving element having a p-type outermost surface in the N-well region has been described. However, it goes without saying that it is also possible to manufacture an NMOS transistor and a light receiving element having an n-type outermost surface in a P-well region. In that case, an ion species, for example, arsenic, phosphorus, or antimony, is used in the ion implantation for forming the shallow pn junction.

Further, in each of the embodiments described above, $BF_2$ is used as the ion species in the ion implantation, but in the ion implantation, for example, boron may be used alone or a cluster ion containing boron may be used.

What is claimed is:

1. A method of manufacturing a semiconductor device, comprising:
    forming a first thermal oxide film serving as a gate oxide film of a MOS transistor on a surface of a silicon substrate having a light receiving element forming region and a MOS transistor forming region;
    forming a polysilicon film on the first thermal oxide film;
    patterning the polysilicon film, to thereby form a gate electrode of the MOS transistor in the MOS transistor forming region;
    removing the first thermal oxide film other than the first thermal oxide film under the gate electrode;
    forming a second thermal oxide film on the surface of the silicon substrate;
    performing ion implantation of an impurity on the light receiving element forming region through the second thermal oxide film, to thereby form an impurity region;
    forming an insulating film on the second thermal oxide film; and
    performing anisotropic etching in a state in which a mask layer is formed on the second thermal oxide film in the light receiving element forming region, such that a side wall comprising the insulating film is formed on a side surface of the gate electrode of the MOS transistor and the insulating film remains in the light receiving element forming region.

2. A method of manufacturing a semiconductor device according to claim 1, wherein the second thermal oxide film is formed on an upper surface and a side surface of the gate electrode.

3. A method of manufacturing a semiconductor device according to claim 1, wherein the impurity is also implanted into the MOS transistor forming region through the ion implantation, to thereby form an LDD region of the MOS transistor.

4. A method of manufacturing a semiconductor device according to claim 1, further comprising:
    forming a first insulating film on the second thermal oxide film;
    forming a second insulating film on the first insulating film; and
    performing anisotropic etching by using the first insulating film as an etching stopper, to thereby form a side wall comprising the second insulating film on a side surface of the gate electrode of the MOS transistor.

5. A method of manufacturing a semiconductor device according to claim 1;
    wherein an impurity concentration of the impurity region at an outermost surface of the silicon substrate is $10^{17}$ $cm^{-3}$ or more, and
    wherein a depth from the surface of the silicon substrate to a point at which the impurity concentration in the impurity region becomes $10^{17}$ $cm^{-3}$ or less is 100 nm or less.

6. A method of manufacturing a semiconductor device according to claim 1, wherein the second thermal oxide film has a thickness of 30 nm or less.

* * * * *